United States Patent [19]

Brasch

[11] Patent Number: 4,762,560

[45] Date of Patent: Aug. 9, 1988

[54] COPPER COLLOID AND METHOD OF ACTIVATING INSULATING SURFACES FOR SUBSEQUENT ELECTROPLATING

[75] Inventor: William R. Brasch, Neconset, N.Y.

[73] Assignee: LeaRonal, Inc., Freeport, N.Y.

[21] Appl. No.: 132,660

[22] Filed: Dec. 10, 1987

Related U.S. Application Data

[63] Continuation-in-part of Ser. No. 931,906, Nov. 14, 1986, abandoned, which is a continuation-in-part of Ser. No. 423,749, Sep. 27, 1982, abandoned.

[51] Int. Cl.$^4$ .............................................. C22C 9/00
[52] U.S. Cl. .................................................. 106/1.11
[58] Field of Search ...................................... 106/1.11

[56] References Cited

U.S. PATENT DOCUMENTS

| | | | |
|---|---|---|---|
| 3,361,580 | 1/1968 | Schneble et al. | 106/1.11 |
| 3,657,002 | 4/1972 | Blodger et al. | 117/141 |
| 3,672,923 | 6/1972 | Zeblisky | 106/1.11 |
| 3,958,048 | 5/1976 | Donovan et al. | 106/1.11 |
| 3,993,799 | 11/1976 | Feldstein | 427/53 |
| 4,228,201 | 10/1980 | Feldstein | 427/92 |
| 4,239,538 | 12/1980 | Feldstein | 106/1.11 |
| 4,259,376 | 3/1981 | Feldstein | 427/304 |

*Primary Examiner*—Robert A. Wax
*Attorney, Agent, or Firm*—Pennie & Edmonds

[57] ABSTRACT

A copper colloid containing a minor amount of an ionizable palladium compound for use in activating non-conductive materials for subsequent electroplating.

16 Claims, No Drawings

COPPER COLLOID AND METHOD OF ACTIVATING INSULATING SURFACES FOR SUBSEQUENT ELECTROPLATING

This application is a continuation-in-part of application Ser. No. 931,906, filed Nov. 14, 1986, abandoned, which is a continuation-in-part of application Ser. No. 423,749, filed Sept. 27, 1982, abandoned.

TECHNICAL FIELD

The invention relates to colloidal copper solutions containing palladium useful for activating non-conductive substrates for subsequent electroless and electrolytic plating.

BACKGROUND OF THE INVENTION

Numerous applications are found commercially today where it is desirable to have a plastic, glass, or other like non-conductive substrate provided with a metal coating on its surface either as a continuous coat or as a patterned or discontinuous coating. Among the applications for such metal coated articles or normally non-conductive materials are circuit boards, automobile hardware, various building and construction hardware, toys, buttons, and the like.

In all such applications the process requires the activation of the non-conductive substrate since electroplating cannot be carried out on such a substrate and electroless plating will also not deposit on such nonconductive surfaces. The activation is followed by an electroless plating which will carry a current for subsequent electroplating or which can alternatively be further electrolessly plated with the same or a different metal.

Commercial prior art activating systems have generally relied upon one or more of the nobel metals, such as palladium. For example, one of the earliest methods of activating such substrates involved a two-step operation involving a first immersion of the substrate in a stannous chloride solution followed by a second immersion in an acid palladium chloride solution. Subsequently a one-step process has been employed commercially, involving a colloidal dispersion of palladium and tin chloride salts as disclosed in U.S. Pat. No. 3,011,920 to Shipley. Still another one-step process is disclosed in U.S. Pat. No. 3,672,923 to Zeblisky which also utilizes noble metals, particularly palladium.

Before activation of the non-conductive substrate, it is generally subjected to various cleaning and etching steps known in the art.

One typical example involving the metal plating of plastics such as acrylonitrile-butadiene-styrene copolymers (ABS) involves the steps of first cleaning the plastic article in a strong alkali followed by etching in a chemical etching bath, frequently a chromic acid etch, which serves to enhance adherence of the metal coatings to the surface. Following the etching step, the article is rinsed in water and dipped in hydrochloric acid to neutralize the chromium, rinsed again, and then placed in the activating solution (frequently referred to as a catalyst, seeder or sensitizer). Commonly this is the colloidal dispersion of palladium and tin chloride in accordance with the above-mentioned U.S. Pat. No. 3,011,920. After sensitizing, the article is again rinsed and then placed briefly in an accelerator to remove the tin, rinsed again, and placed in the conventional electroless metal plating bath. The noble metal of the activating solution, such as palladium, serves to activate, catalyze, or seed the non-conductive substrate for the subsequent electroless plating bath. After a few minutes in the electroless metal plating bath, the article will have a very thin coating of the selected metal of the bath thereon. It is then rinsed and the article may then be further plated with the same or another metal, either by well-known electroplating processes or by further electroless plating.

The U.S. Pat. No. 3,011,920 to Shipley, referred to above, discloses the use of colloidal dispersions of various metals in combination with reducing agents to achieve activation of non-conductive substrates for subsequent electroless plating. The working examples utilize noble metals or hydrous oxides thereof as the colloidal particles and stannous chloride or stannic acid as a reducing agent. The specfication in column 2 refers to the fact that other metals, including numerous non-noble metals such as copper, may similarly be employd to catalyze non-conductive substrates for electroless deposition.

The U.S. Pat. No. 3,657,002 to Kenney discloses a process for preparing hydrous oxide colloids of many different metals including both noble and non-noble metals for treating or coating non-conducting substrates for subsequent electroless plating.

U.S. Pat. No. 3,993,799 issued to Feldstein also discloses the use of a non-noble metal hydrous oxide colloid for treating non-conductive subtrates followed by reduction of the hydrous oxide coating on the substratee to achieve at least a degree of activation for subsequent electroless plating.

U.S. Pat. No. 4,239,538 to Feldstein discloses solutions containing copper ions, stannous ions and a phenol or creosol as a so-called linking agent for treatment of non-conductive substrates for subsequent electroless plating, while Feldstein's U.S. Pat. No. 4,259,376 discloses an emulsion containing copper as the principal catalytic agent and a catalytic promoter consisting of a number of non-noble metals to yield an enhanced catalytic activity for electroless plating of non-conductive substrates.

U.S. Pat. No. 3,958,048 to Donovan discloses a process for the surface activation of non-conductive substrates for electroless plating by treating the surface of the substrate with an aqueous composition containing catalytically active water insoluble particles formed by a reaction of a non-noble metal and a water soluble hydride in the presence of a water soluble organic suspending agent. Copper salts are disclosed as one of the non-noble metals, dimethylamine borane (DMAB) as one of the hydrides, and gelatin as one of the possible organic suspending agents.

The use of copper colloidals for the activation of non-conductive substrates in place of the palladium colloids has recently become commercial to a limited extent. With the use of copper activating colloids it has generally been necessary to utilize a fast electroless copper bath in order to obtain good coverage of the non-conductive substrate by the electroless plating step. When the copper activating colloids are utilized and a slow copper electroless bath employed, the degree of coverage of copper by the electroless bath is decreased significantly. For example, when some copper colloids are utilized with fast bath, 100% coverage can be obtained, but when a slow electroless bath is used the coverage obtained may only be on the order of 50 to 75 percent of the surface of the non-conductive substrate. Thus, one could say that the catalytic activity of the copper colloid is sufficient when employing a fast copper electroless bath, but insufficient when a slow electroless copper bath is employed. The applicant has noticed no significant difference in percent coverage between slow and fast electroless copper baths when utilizing the known palladium activating colloids presently in use. These electroless copper baths, fast and slow, are well known within the industry, and can be best characterized both by the speed of the baths and their stability. Generally, however, a fast electroless copper bath would be capable of depositing about 100 micro inches of copper to the desired surface in about 30 minutes, while a slow electroless copper bath would be capable of depositing 35 to 40 micro inches of copper within about 30 minutes. Fast electroless copper baths are unstable and can only be utilized for short periods of time. This instability is generally due to a rapid imbalance of the chemical makeup of the baths during operation. Thus, these fast baths must be frequently checked and reconstituted to the desired chemical balance in order to obtain electrolessly plated substrates suitable for subsequent electroplating and commercial use. This is a cause of great concern in commercial production of such items as circuit boards. A slow copper electroless bath, however, is quite stable and can be used for long periods of time without chemical adjustments, and the use of such bath is highly desired by industry, particularly where only a flash electroless copper coating is desired or a deposit in the range of 35 to 40 micro inches in thickness. This thickness is all that is generally necessary or desired in the production of circuit boards.

There are many variables which determine whether an electroless copper bath is fast or slow. One of the more important factors in determining the speed of such baths is the temperature used during the electroless plating operation and, to a lesser extent, the amount of chemicals utilized to make up such baths. For example, a fast bath can constitute an aqueous solution containing 8 ml/l of a 37% formaldehyde solution, 10 g/l of sodium hydroxide, and 3 g/l of copper metal supplied by a suitable salt, such as copper sulfate. When operating this bath at about 120° F., it is considered to be a fast bath and will deposit about 100 microinches of copper onto a conductive surface in about 30 minutes. An example of a slow bath would be an aqueous solution containing about 20 ml/l of a 37% formaldehyde solution, 15 g/l of sodium hydroxide, and 3 g/l of copper metal; again supplied to the solution by means of a suitable salt. When this bath is operated at about 75° F. or room temperature, it is considered to be a slow bath and it will deposit between about 35 and 40 microinches of copper to a conductive or activated surface in about 30 minutes. When such a slow bath is operated at higher temperatures, such as about 95° F., it becomes a fast electroless copper bath. All of this is known in the art and the terms "slow" and "fast" electroless copper baths are terms of the art.

All of these electroless copper baths also contain stabilizers and complexing agents for the copper. These stabilizing and complexing agents are also well known in the art. The applicant prefers to use divalent sulfur compounds as stabilizing agents, such as those disclosed in the Schneble U.S. Pat. No. 3,361,580, plus a small amount of cyanide ion. The amount of stabilizing agent can be varied in these baths depending upon whether the bath to be employed is a slow or fast bath. Generally it is advisable to increase the amount of stabilizing agent when a fast bath is being employed. This is also well known to those skilled in the art and regulation of the stabilizing agent to obtain optimum stability will depend upon the makeup of the particular bath being employed and the operating temperature of the bath.

The complexing agents are also well known in the art and include such materials as the carboxylic acid type complexing agents, amine carboxylic acid complexing agents, such as EDTA, aliphatic carboxylic acids, such as citric acid, tartrates, and Rochelle salt.

DISCLOSURE OF THE INVENTION

This invention comprises the discovery that the addition of a small amount of ionic palladium (reducible to palladium metal) to copper colloid activating solutions significantly increases the coverage of the electroless copper deposition when utilizing a slow electroless copper bath. In one instance, for example, the coverage obtained by utilization of a slow electroless copper bath with a copper colloid can be increased from between 50 and 75 percent coverage to 100 percent coverage. The extent increase in coverage or catalytic activity will depend upon the particular copper colloid being employed, but in all cases tested by the applicant, the increase in coverage has been found to be very significant.

It is advantageous to add as little palladium metal as possible to the copper colloids for economic reasons. A sufficient amount of palladium metal should be added to increase the coverage of the electroless copper deposit to that desired. The most advantageous amount of palladium metal has been determined to date to be between about 20 and 40 parts per million (ppm) although considerably lower amounts can be used. The minimum amount of palladium metal will also depend somewhat upon the speed of the electroless copper bath and the particular ionic palladium compound employed but is generally no less than about 8 ppm. Amounts above 12 ppm provide an unexpected increase in coverage of the electroless metal deposit.

Although the applicant has given an example of a slow bath which will deposit approximately 35 to 40 micro inches of copper in about 30 minutes, slightly faster baths could be employed if the coverage is not that desired. For example, if one obtains a coverage of 90% with such an electroless copper bath, and desires higher coverage for subsequent electro-deposition, one can increase the speed of the bath by appropriate chemical adjustment or increase in the temperature to obtain the desired coverage so long as the speed of the bath is not increased to a degree that this bath becomes unstable; for example, the electroless copper bath could be regulated to give a deposit of 50 to 60 micro inches to improve coverage while still maintaining the stability of the bath. Increase in the coverage may also be accomplished by regulation of the palladium content.

The upper limit of palladium metal will depend upon the particular ionic palladium compound added to the colloid, the effect of the anion of the ionic palladium compound on the stability of the bath, and the stability of the activating colloid itself. Thus, one can add the palladium in an amount which will retain the stability of the activating solution. The addition of palladium metal in excess of about 80 ppm of palladium metal causes coagulation of the colloid and renders it unstable. The amount of palladium metal should thus be limited to below about 80 ppm or to that amount which does not adversely affect the stability of the copper colloid. With other colloids, such as those set forth in Examples 1, 2 and 3 below, which are less stable to begin with, the colloids will probably coagulate or be rendered unstable when amounts of palladium metal of less than about 80 ppm are added thereto. Thus, the maximum amount of palladium metal that is added is that which will retain sufficient stability of the colloid so that the non-conductive substrate can be adequately activated by the colloid for subsequent electroless plating.

The palladium is added to the colloid in the ionic state. Experiments to date have shown that most any palladium compound or salt capable of ionization and reduction can be used, such as the palladium chloride acid salt and palladium ammonium chloride; the latter being presently preferred. The addition of palladium metal, such as that contained in the commercial palladium/tin activating catalysts in the amount of 20 ppm of the palladium metal, causes some precipitation of the copper colloid, and when an attempt is made to use this copper colloid containing the palladium metal added from a palladium activatiing colloid, zero coverage is obtained when utilizing a slow electroless copper bath. When utilizing a palladium metal colloid containing 20 ppm of palladium alone without the presence of the copper colloid, only 60% coverage is obtained from the slow electroless copper baths.

The ionic palladium added to the copper colloid is reduced at some stage to palladium metal prior to electroless plating. Thus, the palladium compounds can be added directly to the copper colloid if it contains an excess of reducing agent or during the preparation of the colloid if the colloid is prepared by a reduction technique, such as disclosed in the above U.S. patent to Donovan. The palladium can also be added to colloids prepared by a precipitation process, such as disclosed in the Feldstein U.S. Pat. No. 3,993,799 and the ionic palladium reduced after the colloid has been coated on the non-conductive substrate by immersion of the coated substrate into a reducing agent.

In all of the following examples, the test panels were composed of the standard glass-epoxy material normally used in the production of printed circuits and containing no copper cladding. The elecroless copper bath utilized was a slow copper bath containing 20 ml/l of 37% formaldehyde, 15 g/l of sodium hydroxide, 3 g/l of copper metal as copper sulfate, a divalent sulfur stabilizer, such as disclosed in U.S. Pat. No. 3,361,580, in a sufficient amount to stabilize the bath, and a carboxylic acid complexing agent for the copper. The bath was operated at 75° F. and the palladium metal added as palladium metal chloride. The time of immersion in the electroless copper bath was approximately 30 minutes.

EXAMPLE 1

A copper colloid was prepared in accordance with Example 2 of the Donovan U.S. Pat. No. 3,958,048, and a glass filled epoxy panel was immersd in the colloid, and an attempt was made to electrolessly plate the treated panel with the above-noted slow electroless copper bath. No coverage or plating of copper was noted after 30 minutes immersion time. 20 ppm of palladium metal was then added to this same colloid as palladium ammonium chloride. The palladium ammonium chloride was added to the colloid after its preparation since the prepared colloid contained sufficient excess reducing agent capable of reducing the ionic palladium contained therein to palladium metal. The panel was activated by the copper colloid containing the palladium by immersion, and then electrolessly plated with the same copper bath. The coverage of the electroless deposit on the panel found to be about 70% after 30 minutes.

EXAMPLE 2

A hydrous oxide was prepared according to Example 12 of the Feldstein U.S. Pat. No. 3,993,799 by the precipation method utilizing copper acetate and ammonium hydroxide. This hydrous oxide colloid was then used to coat the glass epoxy panel and the hydrous oxide reduced by immersing the treated panel into a potassium borohydride solution. The panel was then subjected to electroless deposition by means of the slow electroless copper bath described above. The coverage obtained from the electroless copper bath was approximately 25%.

20 ppm of palladium ammonium chloride was added to the same hydrous oxide colloid described above prior to reduction and a panel activated therewith. After reduction in the same potassium borohydride solution, and electrolessly plating with the same electroless copper solution, an 80% coverage of the panel was obtained.

EXAMPLE 3

A copper colloid was prepared in accordance with Example 4 of the Feldstein U.S. Pat. No. 4,259,376 without the manganese chloride. The standard glass epoxy panel was treated with this colloid and subjected to the standard electroless solution as described above. The coverage of the electroless copper was found to be about 20%.

Example 4 of Feldstein was again repeated adding the manganese chloride and the coverage of the electroless copper deposition was found to be about 35%. When the same colloid was produced and 20 ppm of palladium ammonium chloride added thereto in place of the manganese chloride, and the procedure repeated, the coverage from the standard slow electroless copper bath was found to be approximately 75%.

EXAMPLE 4

A copper colloid was prepared as follows:

20 g/l of $CuSO_4.5H_2O$ (providing 5 g/l $Cu°$) is dissolved in warm water (at about 90° F.). 2 g/l of Type A gelatin (100 bloom) is dissolved separately in another container in warm water after which it is added to the copper sulfate solution. The pH is adjusted to about 2.5 with 25% $H_2SO_4$ and the temperature maintained at about 90° F. 5 g/l dimethylamine borane (DMAB) is dissolved separately in warm water and then added under conditions of agitation to the copper sulfate-gelatin solution after adjustment of the pH. The solution is then diluted to a final volume of 1 liter. The temperature is adjusted as necessary to between 80°–90° F. and the mixture stirred until the reaction started (about 5–10 minutes). The onset of the reaction is readily determined by the color change from a blue to a lighter blue and then to green. The stirriing is then stopped and the solution is allowed to react overnight or for about 24 hours without stirring or applied heat. During this time the solution cools to room temperature and upon completion of the reaction the colloid is reddish black.

After the solution is allowed to react for 24 hours as described above, 10 ml/l of hydrazine hydrate is added. After an additional 24 hours or reaction time, the colloid has a pH of 7 and is ready for use; however, it is preferred to age the colloid for 3 to 4 weeks in a closed container before use.

The colloid was then used to activate the standard glass epoxy panel and subjected to electroless plating in the same standard slow copper electroless bath. The coverage of the electroless copper on the panel was found to be between 50 and 75%.

20 ppm of palladium ammonium chloride was then added to this same copper activating colloid containing an excess of reducing agent after its preparation and again subjected to electroless plating by the same standard copper electroless plating bath. The coverage of the electroless plating on the activated substrate was found to be 100%.

The reduction of the copper compounds according to Example 4 is initiated under acid conditions at a pH between about 1.5 and 4.0. At pH's of about 1.5 and 4.0, the reduction of the copper compound is relatively slow and the reduction may only partially occur. At pH's substantially outside the indicated range, and especially at the higher pH's, the desired colloid does tend not to form. The optimum pH, both for rate of reaction and reduction of the copper compound, is between about 2.0 and 2.5. The pH can be lowered to the most advantageous range by the addition of an acid, advantageously sulfuric acid when copper sulfate is used as the copper compound being reduced.

The reducing agent used is preferably dimethylamine borane (DMAB). Other reducing agents may be used but they should have a reducing power substantially the same as or equivalent to the preferred reducing agent DMAB under acid conditions. These may include, alone or in combination, hydrazine hydrate, potassium borohydride and sodium hydrosulfite, although certain reducing agents may be too weak to promote the copper compound reduction reaction according to this invention. The borohydrides maY be capable of use if dissolved and the pH lowered to that approximately of DMAB. The relative amount of reducing agent is not very critical although the reducing agent should preferably be present in about 2.5–7.5 g/liter of colloidal solution and most preferably in about 5 g/liter and be in excess of that necessary for reducing the copper salt.

The most advantageous stabilizing agent is gelatin. The use of other agents, such as polyvinyl alcohol, polyacrylamide, sodium alginate, although operable to varying degrees, do not result in as stable a colloid as when gelatin is used. The role of the gelatin in the preparation of the activating colloids, or in the final colloid itself, is to stabilize the colloid. The colloid can be prepared in the absence of the gelatin, and although useful, it is not sufficiently stable for competitive commercial use with the presently used palladium-tin colloids. The gelatin should be preferably present in about 1–3 g/liter of colloidal solution and most preferably in about 2 g/liter.

Copper compounds that can be reduced according to the process of Example 4 include copper sulfate, preferably the hydrate $CuSO_4.5H_2O$, copper phosphite, copper phosphate, and copper sulfamate. Copper acetate can also be used but has not as yet been proven to be as good as the sulfates. Experiments to date indicate that copper chloride, copper nitrate, copper citrate, and copper formate produce colloids of fairly poor quality. The reasons for the relatively poor results obtained with these copper compounds is not as yet known. The relative amount of copper is not very critical although the copper compound should advantageously be present such that the Cu° value thereof is about 2.5–7.5 g/liter of colloidal solution and most advantageously in about 5 g/liter. Thus, in the case of $CuSO_4.5H_2O$, the same should be present in about 10–30 g/liter and most advantageously in about 20 g/liter before reduction.

In line with the above, it can be seen that it is advantageous that the ratio of the reducing agent to the Cu° value of the copper compound be about 1/1 by weight or in excess.

When these colloidal solutions are used to activate plastic non-conductive substrates, metallic copper is directly deposited on the substrate which causes the activation. There are apparently other copper compounds, and these may be copper oxides of some sort, present in the colloids judging from their color. These other copper compounds, however, do not interfere to any significant extent with the direct deposits of the metallic copper present in the colloids onto the non-conductive plastic substrate. It may be that the other copper compounds present in the colloidal solutions are in a charged state that prohibits their deposition on the non-conductive plastic substrate to any significant extent or that the relative difference between the colloidal copper metal and the copper compounds are of such a nature that the copper metal preferentially deposits on the non-conductive plastic substrate. The fact remains, however, that when the non-conductive plastic substrate is dipped into the colloidal solution, the layer that results thereon is primarily metallic copper to the substantial exclusion of the other components of the colloidal solution. This phenomenon has been confirmed by Electron Spectroscopy for Chemical Analysis (ESCA).

The temperature of the reduction reaction is not at all critical. The reaction will take place at room temperature but it is preferable to add a small amount of heat so that the reaction takes place at about 80° to 90° F. Higher temperatures (120°–130° F.) can be used if desired, but it is the types and amounts of reactants and the pH that mainly control the reaction. The reaction starts out gradually and may take 5 to 10 minutes before it is noticeable. With copper sulfate the onset of the reaction can be observed by color changes, generally from a deep blue to a light blue and then to green. After the first part of the reaction has been completed, as indicated by the color change, any heating or agitation being employed is stopped and the reaction mixture is allowed to stand or further react for about 24 hours. After 24 hours the colloid can be used; however, best results are obtained after the colloid is aged for 3 to 4 weeks in a closed container.

The colloid stability may be further enhanced by the addition thereto, after the initial reaction, of an additional reducing agent such as hydrazine hydrate, phenylhydrazine and hydroxylamine sulfate or even additional DMAB. The additional reducing agent is advantageously added to the colloid after the colloid has been aged or permitted to stand for about 24 hours but can be added at other stages after completion of the initial reaction if desired.

The pH of the colloids after aging for about 24 hours is about 7, and they can be used directly at this advantageous pH but the colloid can be used for activating non-conductive surfaces for electroless plating over a wide pH range. The pH can be adjusted to that desired by the addition of acids (sulfuric acid) or alkali materials (sodium hydroxide) as will be appreciated by those skilled in the art. During use, the pH of the colloid may drop but in practice the colloid solution is replenished from time to time with additional colloid which tends to bring the pH back up toward 7.

The types of non-conductive substrates that can be activated according to this invention are the same as those indicated in the patents referred to above. The colloids of the invention are particularly advantageous for activating plastics such as epoxy-glass, phenolic glass, ABS-glass, phenolic-paper, etc., and the non-conductive portions of laminated circuit boards. These circuit boards, as is well known, are generally composed of such plastic compositions having two thin sheets of copper foil laminated to both sides of the plastic and having appropriate holes drilled through both copper sheets and the plastic. The plastic portion of the laminate, such as that exposed by the drilled holes, must be electroplated to provide continuity of electro conductivity throughout the circuit board. Thus, the exposed plastic portion of the laminate must be activated for electroless metal plating and subsequent electro metal plating.

Although the colloids of Example 4 can be used at widely different concentrations, the invention, as particularly applied to printed circuit boards, has the advantage that copper metal is deposited directly from the colloids not only to a sufficient extent on the plastic or glass fillers, but also to a limited extent on the copper clad or laminate portion of the printed circuit board. One reason for this is that the colloids of this invention can be used in very dilute solutions. Preferably the colloid, such as produced in Example 4, is diluted with about 70 parts by volume of water for every 30 parts by volume of the colloid or the equivalent thereof but more advantageously about 85 parts water to 15 parts colloid. This is of particular significance when the colloid is used to activate the plastic portion of circuit board laminates since it prevents too high a deposition of the copper metal from the colloid onto the copper portions of the laminate which might interfere with the adhesion of the copper subsequently to be deposited thereon from the electroless copper bath. Particularly in the case of the activation of clad or laminated materials such as printed circuit boards, it has been found that if the activated or catalyzed substrate is first dipped in neutralized hydrazine hydrate for a very short period of time prior to its treatment with the electroless bath, there results an improved bond between the electroless deposit and the copper portions of the substrate.

In activating non-clad or non-laminated plastic articles, colloids of such as in Example 4 are used by diluting the colloid with 60 parts by volume of water. To activate such circuit boards, it is advantageous to use colloids which have a particle size of between about 10 and 100 angstroms, a particle zeta potential of between about +3 and +12 millivolts (MV), advantageously between about 4 and 10 MV, and which colloid contains a sufficient number of particles to sufficiently activate the surface of the non-conductor so it can be successfully electrolessly plated. The colloids produced according to Example 4 are diluted to contain about 0.7 to 0.9 g/l of colloid particles for operation. One advantage of the colloids of Example 4 resides in the fact that the particles are not only small but also have a low positive zeta potential. The colloids are also stable, that is, the particle size does not grow causing the particles to precipitate out leaving a few particles to effect activation or to cause alteration of the zeta potential to a degree that the particles will not adhere sufficiently to the substrate.

Actually the colloidal copper particles themselves do not have a zeta potential of between about +3 and +12 mv. The particles are altered by treatment with the suspending or stabilizing agent to possess the desired zeta potential. Thus, the suspending agent itself has a zeta potential of a sufficient value to form a composite particle which has the desired zeta potential or somehow alters the zeta potential or metallic copper and/or copper oxide particles to within the desired range. Thus, a stabilizing agent may have a zeta potential of about +18 mv when combined with copper particles having a minus zeta potential causing the composite particles so formed to have a zeta potential within the desired range of +3 to +12 mv. It would be routine for a person skilled in the art to measure zeta potentials and select the correct suspending agent to produce a colloid having the desired zeta potential when given the teachings of this application. Not all suspending agents will give the desired zeta potential; it depends on the purity of the suspending agent and/or the manner in which it was produced or purified, the presence or absence of ions, etc. An example of such a stabilizer is acid washed Type A gelatin. It should also be a relative pure Type A gelatin, free of significant impurities, such as excess sodium ions, that would interfere with obtaining the desired zeta potential. Other stabilizing agents could be used in place of gelatin, so long as they possess the desired zeta potential and do not highly disassociate and migrate from the copper particles.

Although the invention is particularly advantageous when utilized with copper colloids prepared as in Example 4 (or alternative methods as disclosed herein), the invention is also advantageously applicable to all copper colloids whether metallic or hydrous oxides.

I claim:

1. The method of preparing a copper colloid for activation of a non-conducting substrate which comprises adding a minor amount of an ionizable palladium compound to the copper colloid and reducing the palladium compound therein to form metallic palladium particles in an amount at least about 8 ppm to maintain the copper colloidal particles as the primary activating agent but less than about 80 ppm.

2. The method of claim 1 in which the copper colloid contains excess reducing agent after its preparation and the palladium compound is added thereto after the copper colloid has been prepared.

3. The method of activating a non-conducting substrate comprising treating the substrate with a composition containing a minor amount of at least about 8 ppm of an ionizable palladium compound and a major amount of hydrous oxide copper colloid particles containing a sufficient amount of reducing agent to reduce the ionizable palladium compound to less than about 80 ppm of palladium metal and reducing the hydrous oxide colloid and the ionizable palladium compound to metallic copper and metallic palladium while adhered to said conducting substrate and in which the metallic copper is the primary activating agent.

4. An aqueous copper colloid for the activation of non-conductive substrates for subsequent electroless plating comprising colloidal particles of metallic copper and a minor amount of at least about 8 ppm palladium metallic particles formed by reduction of an ionizable palladium compound within said copper colloid after or during preparation of the copper colloid by reduction of a copper compound.

5. A non-conductive substrate having activating sites thereon sufficient to permit electroless plating thereon in which the activated sites comprise a mixture of a major amount of copper metal and a minor amount of palladium metal but less than about 80 ppm.

6. A stable aqueous colloid for the activation of non-conductive substrates for electroless plating which comprises particles of metallic copper and/or copper oxide having a particle size of between about 10 and 100 millimicrons and having a zeta potential between about +3 and +12 millivolts, said colloid having an amount of particles to activate the surface of a non-conductor and containing a minor proportion of at least about 8 ppm of palladium produced by reduction from an ionizable palladium compound but less than about 80 ppm within said colloid or during preparation of the colloid by reduction of a copper compound.

7. The method of claim 1 wherein the amount of palladium metal is at least about 12 ppm but less than about 40 ppm.

8. The method of claim 3 wherein the amount of palladium metal is at least about 12 ppm but less than about 40 ppm.

9. The colloid of claim 4 wherein the palladium metal content is at least about 12 ppm but less than about 40 ppm.

10. The substrate of claim 5 wherein the palladium metal content is at least about 12 ppm but less than about 40 ppm.

11. The colloid of claim 6 wherein the palladium metal content is at least about 12 ppm but less than about 40 ppm.

12. The method of claim 1 wherein the amount of palladium metal is between about 20 and 40 ppm.

13. The method of claim 3 wherein the amount of palladium metal is between about 20 and 40 ppm.

14. The method of claim 4 wherein the palladium metal content is between about 20 and 40 ppm.

15. The method of claim 5 wherein the palladium metal content is between about 20 and 40 ppm.

16. The method of claim 6 wherein the palladium metal content is between about 20 and 40 ppm.

* * * * *